(12) United States Patent
Mishima et al.

(10) Patent No.: US 7,618,717 B2
(45) Date of Patent: Nov. 17, 2009

(54) LIGHT EMITTING DEVICE

(75) Inventors: Masayuki Mishima, Minami-Ashigara (JP); Tatsuya Igarashi, Minami-Ashigara (JP); Kazumi Nii, Minami-Ashigara (JP); Tetsuo Nakamura, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 449 days.

(21) Appl. No.: 11/062,439

(22) Filed: Feb. 23, 2005

(65) Prior Publication Data

US 2005/0191519 A1 Sep. 1, 2005

(30) Foreign Application Priority Data

Feb. 27, 2004 (JP) .................. P.2004-053158
Sep. 17, 2004 (JP) .................. P.2004-271134

(51) Int. Cl.
*H01L 51/54* (2006.01)

(52) U.S. Cl. .................. 428/690; 428/917; 313/504; 257/E51.043; 257/E51.044

(58) Field of Classification Search .................. None
See application file for complete search history.

(56) References Cited

U.S. PATENT DOCUMENTS

| 4,769,292 | A * | 9/1988 | Tang et al. .................. 428/690 |
| 6,303,238 | B1 | 10/2001 | Thompson et al. |
| 2001/0019782 | A1 * | 9/2001 | Igarashi et al. .............. 428/690 |
| 2003/0068526 | A1 | 4/2003 | Kamatani et al. |
| 2003/0072964 | A1 * | 4/2003 | Kwong et al. ................ 428/690 |
| 2003/0129452 | A1 * | 7/2003 | Tsuji et al. .................. 428/690 |
| 2004/0137268 | A1 * | 7/2004 | Igarashi et al. .............. 428/690 |
| 2006/0063030 | A1 * | 3/2006 | Deaton et al. ............... 428/690 |
| 2006/0063031 | A1 * | 3/2006 | Brown et al. ................ 428/690 |

FOREIGN PATENT DOCUMENTS

| JP | 2001-247859 A | 9/2001 |
| JP | 2003-142264 A | 5/2003 |

OTHER PUBLICATIONS

Applied Physics Letter, 1999, vol. 75, "Very high-efficiency green organic light-emitting devices based on electrophosphorescence", M.A. Baldo et al., p. 4-6.
Japanese Journal of Applied Physics, 1999, vol. 38, "High Quantum Efficiency in Organic Light-Emitting Devices with Iridium-Complex as a Triplet Emissive Center", Tetsuo Tsutsui et al., p. L1502-L1504.

* cited by examiner

*Primary Examiner*—Marie R. Yamnitzky
(74) *Attorney, Agent, or Firm*—Birch, Stewart, Kolasch & Birch, LLP

(57) ABSTRACT

To provide an organic electroluminescent device having excellent durability and having high luminous efficiency and luminance, which can be effectively utilized for surface light sources such as full color displays, backlights, and illuminating light sources and light source arrays such as printers, the organic electroluminescent device includes at least one organic compound layer containing a light emitting layer between a pair of electrodes, wherein the light emitting layer contains a host material and a phosphorescent material; the host material is a five-coordinate metal complex; and the phosphorescent material is at least one Ir complex having a specific partial structure.

12 Claims, No Drawings

LIGHT EMITTING DEVICE

FIELD OF THE INVENTION

The present invention relates to a light emitting device having extremely excellent durability and having extremely high luminance and luminous efficiency, and in particular, to a light emitting device suitable as an organic electro-luminescent device.

BACKGROUND OF THE INVENTION

Organic electroluminescent devices using an organic substance are promising in applications as a cheap large-area full-color display device having a solid light-emitting solid-state device and a light source array for writing, and a number of developments have been carried out. In general, an organic electroluminescent device is constructed of a light emitting layer and a pair of counter electrodes having therebetween the light emitting layer. The light emission is a phenomenon in which when an electric field is applied between the counter electrodes, an electron is injected from the cathode; a hole is injected from the anode; the electron and the hole are re-coupled in the light emitting layer; and energy is released as light when the energy level is returned to a valence band from a conduction band.

However, in the case of such an organic organic electroluminescent device, there is a serious problem that the luminous efficiency is very low as compared with inorganic LED devices and fluorescent tubes. Almost all of organic electroluminescent devices which are currently proposed are ones utilizing fluorescent light emission obtained by a singlet exciton of an organic light emitting material. In a simple mechanism of the quantum chemistry, in the exciton state, a ratio of the singlet exciton from which fluorescent light emission is obtainable to the triplet exciton from which phosphorescent light emission is obtainable is ⅓. Therefore, so far as the fluorescent light emission is utilized, only 25% of the exciton can be effectively applied so that the luminous efficiency is low. On the other hand, if phosphorescence obtainable from the triplet exciton can be utilized, the luminous efficiency should be able to be enhanced.

Then, in recent years, organic electroluminescent devices utilizing phosphorescence with a phenylpyridine complex of iridium have been reported (see, for example, *Applied Physics Letter*, 1999, Vol. 75, page 4, *Japanese Journal of Applied Physics*, 1999, Vol. 38, page L1502 and U.S. Pat. No. 6,303, 238). These documents report that such organic electroluminescent devices exhibit the luminous efficiency of 2 to 3 times as compared with the conventional organic electroluminescent devices utilizing fluorescence.

A phosphorescent organic electroluminescent device is principally constructed of anode/hole transporting layer/light emitting layer/block layer/electron transportingting layer/cathode. The light emitting layer is principally composed of a host material for undergoing energy transfer of triplet exciton energy into a light emitting material and a phosphorescent material. In general, carbazole compounds such as CBP (4,4'-N,N"-dicarbazole-biphenyl) are frequently used as the host material.

A problem which is involved in this phosphorescent organic electroluminescent device resides in its durability, and an improvement of this problem is eagerly demanded. As a measure for improving the durability, various phosphorescent materials have been proposed (see JP-A-2001-247859). However, it is the present state that satisfactory durability has not been obtained yet.

On the other hand, there is proposed a method in which electron transporting aluminum(III) bis(2-methyl-8-quinolinato)-4-phenylphenolate (hereinafter abbreviated as "Balq$_2$") is used as the host material in place of the CBP (see JP-A-2003-142264).

In the foregoing document, it is designed to enhance the durability in a device using platinum porphyrin as the light emitting material and Balq$_2$ as the host material. However, the durability is still insufficient, and an organic electroluminescent device having high luminous efficiency and excellent durability is eagerly demanded.

SUMMARY OF THE INVENTION

An object of the invention is to provide an organic electroluminescent device having excellent durability and having high luminous efficiency and luminance.

The present inventors made extensive and intensive investigations. As a result, it has been astonishingly found that by combining a specific phosphorescent material as the light emitting material with the foregoing Balq$_2$ as the host material, not only the luminous efficiency is high, but also an effect for enhancing the durability is more than the expected.

According to the invention, the following organic electroluminescent devices are provided, whereby the foregoing object of the invention is achieved.

<1> An organic electroluminescent device comprising:
a pair of electrodes; and
at least one organic compound layer between the pair of electrodes, the at least one organic compound layer comprising a light emitting layer,
wherein the light emitting layer comprises: a host material comprising a five-coordinate metal complex; and a phosphorescent material comprising an Ir complex (i.e., iridium complex) having a partial structure represented by one of formulae (2) to (5):

Formula (2)

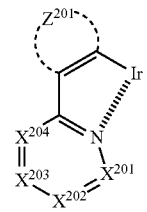

wherein $X^{201}$, $X^{202}$, $X^{203}$, and $X^{204}$ each independently represents a nitrogen atom or C—R; $X^{201}$, $X^{202}$, $X^{203}$, and $X^{204}$ forms a nitrogen-containing heteroaryl 6-membered ring together with —C=N; at least one of $X^{201}$, $X^{202}$, $X^{203}$, and $X^{204}$ represents a nitrogen atom; R represents a hydrogen atom or a substituent; and $Z^{201}$ represents an atomic group for forming an aryl ring or a heteroaryl ring, Formula (3)

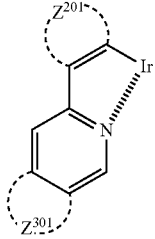

wherein $Z^{201}$ and $Z^{301}$ each independently represents an atomic group for forming an aryl ring or a heteroaryl ring, Formula (4)

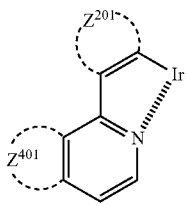

wherein $Z^{201}$ and $Z^{401}$ each independently represents an atomic group for forming an aryl ring or a heteroaryl ring, and Formula (5)

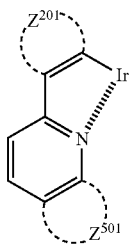

wherein $Z^{201}$ and $Z^{501}$ each independently represents an atomic group for forming an aryl ring or a heteroaryl ring.

<2> The organic electroluminescent device as set forth above in <1>, wherein the phosphorescent material is an Ir complex having a partial structure represented by formula (2).

<3> The organic electroluminescent device as set forth above in <1> or <2>, wherein the phosphorescent material is an Ir complex represented by formula (22):

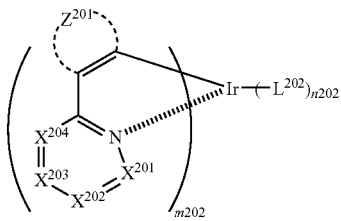

wherein $X^{201}$, $X^{202}$, $X^{203}$, and $X^{204}$ each independently represents a nitrogen atom or C—R; $X^{201}$, $X^{202}$, $X^{203}$, and $X^{204}$ forms a nitrogen-containing heteroaryl 6-membered ring together with —C═N; at least one of $X^{201}$, $X^{202}$, $X^{203}$, and $X^{204}$ represents a nitrogen atom; R represents a hydrogen atom or a substituent; $Z^{201}$ represents an atomic group for forming an aryl ring or a heteroaryl ring; $L^{202}$ represents a ligand; $n^{202}$ represents an integer of from 0 to 5; and $m^{202}$ represents 1, 2 or 3.

<4> The organic electroluminescent device as set forth above in <1>, wherein the phosphorescent material is an Ir complex having a partial structure represented by formula (3).

<5> The organic electroluminescent device as set forth above in <1> or <4>, wherein the phosphorescent material is an Ir complex represented by formula (23):

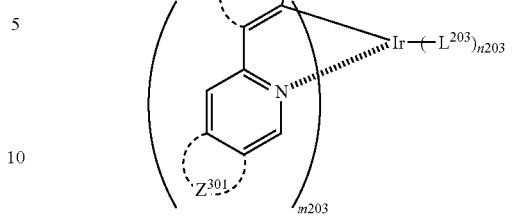

wherein $Z^{201}$ represents an atomic group for forming an aryl ring or a heteroaryl ring; $Z^{301}$ represents an atomic group for forming an aryl ring or a heteroaryl ring to be fused with the pyridine ring; $L^{203}$ represents a ligand; $n^{203}$ represents an integer of from 0 to 5; and $m^{203}$ represents 1, 2 or 3.

<6> The organic electroluminescent device as set forth above in any one of <1>, <4> and <5>, wherein the phosphorescent material is an Ir complex represented by formula (3-1):

(3-1)

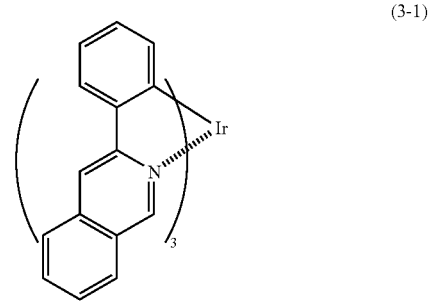

<7> The organic electroluminescent device as set forth above in <1>, wherein the phosphorescent material is an Ir complex having a partial structure represented by formula (4).

<8> The organic electroluminescent device as set forth above in <1> or <7>, wherein the phosphorescent material is an Ir complex represented by formula (24):

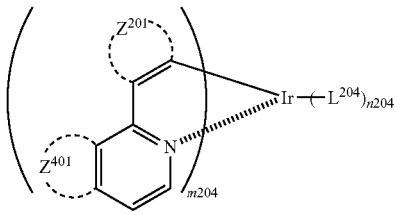

wherein $Z^{201}$ represents an atomic group for forming an aryl ring or a heteroaryl ring; $Z^{401}$ represents an atomic group for forming an aryl ring or a heteroaryl ring to be fused with the pyridine ring; $L^{204}$ represents a ligand; $n^{204}$ represents an integer of from 0 to 5; and $m^{204}$ represents 1, 2 or 3.

<9> The organic electroluminescent device as set forth above in any one of <1>, <7> and <8>, wherein the phosphorescent material is an Ir complex represented by formula (4-1):

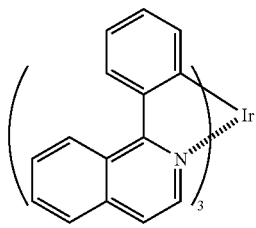

(4-1)

<10> The organic electroluminescent device as set forth above in <1>, wherein the phosphorescent material is an Ir complex having a partial structure represented by formula (5).

<11> The organic electroluminescent device as set forth above in <1> or <10>, wherein the phosphorescent material is an Ir complex represented by formula (25):

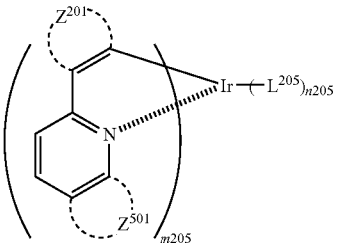

wherein $Z^{201}$ represents an atomic group for forming an aryl ring or a heteroaryl ring; $Z^{401}$ represents an atomic group for forming an aryl ring or a heteroaryl ring to be fused with the pyridine ring; $L^{204}$ represents a ligand; $n^{204}$ represents an integer of from 0 to 5; and $m^{204}$ represents 1, 2 or 3.

<12> The organic electroluminescent device as set forth above in any one of <1> to <11>, wherein the five-coordinate metal complex is an Al complex, a Ga complex, or an In complex.

<13> The organic electroluminescent device as set forth above in any one of <1> to <12>, wherein the five-coordinate metal complex is a compound represented by formula (101):

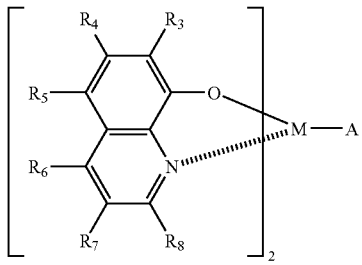

wherein M represents Al, Ga, or In; $R_3$ to $R_8$ each independently represents a hydrogen atom, an alkyl group, or an alkoxy group; A represents —O—Ar or a halogen atom; and Ar represents an optionally substituted aryl group.

<14> The organic electroluminescent device as set forth above in any one of <1> to <13>, wherein M represents Al.

<15> The organic electroluminescent device as set forth above in any one of <1> to <14>, wherein the five-coordinate metal complex is aluminum(III) bis(2-methyl-8-quinolinato)-4-phenylphenolate.

In the organic electroluminescent device of the invention, according to the foregoing construction, by using a five-coordinate metal complex as the host material and a light emitting material having the foregoing specific structure as the light emitting material in the light emitting layer, it is possible to obtain an organic electroluminescent device capable of largely enhancing the durability and having excellent luminous efficiency.

According to the invention, it is possible to provide an organic electroluminescent device having extremely excellent durability and having extremely high luminance and luminous efficiency. The organic electroluminescent device of the invention can be effectively utilized for surface light sources such as full color displays and backlights and light source arrays such as printers.

DETAILED DESCRIPTION OF THE INVENTION

The organic electroluminescent device of the invention is an organic electroluminescent device comprising at least one organic compound layer containing a light emitting layer between a pair of electrodes, wherein the light emitting layer contains a host material and a phosphorescent material; a five-coordinate metal complex is used as the host material; and an Ir complex having a partial structure represented by any one of formulae (2) to (5) is used as the phosphorescent material.

The Ir complex having a partial structure represented by formula (2) will be described below in detail. The Ir complex having a partial structure represented by formula (2) can be specifically represented by formula (22):

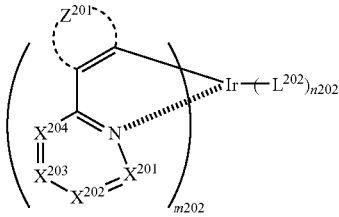

In formulae (2) and (22), $X^{201}$, $X^{202}$, $X^{203}$, and $X^{204}$ each independently represents a nitrogen atom or C—R; $X^{201}$, $X^{202}$, $X^{203}$, and $X^{204}$ forms a nitrogen-containing heteroaryl 6-membered ring together with —C=N; at least one of $X^{201}$, $X^{202}$, $X^{203}$, and $X^{204}$ represents a nitrogen atom; and R represents a hydrogen atom or a substituent.

Examples of the substituent include an alkyl group (preferably having from 1 to 30 carbon atoms, more preferably from 1 to 20 carbon atoms, and especially preferably from 1 to 10; for example, methyl, ethyl, isopropyl, tert-butyl, n-octyl, n-decyl, n-hexadecyl, cyclopropyl, cyclopentyl, and cyclohexyl), an alkenyl group (preferably having from 2 to 30 carbon atoms, more preferably from 2 to 20 carbon atoms, and especially preferably from 2 to 10 carbon atoms; for example, vinyl, allyl, 2-butenyl, and 3-pentenyl), an alkynyl group (preferably having from 2 to 30 carbon atoms, more preferably from 2 to 20 carbon atoms, and especially preferably from 2 to 10 carbon atoms; for example, propargyl and 3-pentynyl), an aryl group (preferably having from 6 to 30 carbon atoms, more preferably from 6 to 20 carbon atoms, and especially preferably from 6 to 12 carbon atoms; for example, phenyl, p-methylphenyl, naphthyl, and anthranyl), an amino group (preferably having from 0 to 30 carbon atoms, more preferably from 0 to 20 carbon atoms, and especially preferably from 0 to 10 carbon atoms; for example, amino, methylamino, dimethylamino, diethylamino, dibenzylamino, diphenylamino, and ditolylamino), an alkoxy group (preferably having from 1 to 30 carbon atoms, more preferably from 1 to 20 carbon atoms, and especially preferably from 1 to 10 carbon atoms; for example, methoxy, ethoxy, butoxy, and 2-ethylhexyloxy), an aryloxy group (preferably having from 6 to 30 carbon atoms, more preferably from 6 to 20 carbon atoms, and especially preferably from 6 to 12 carbon atoms; for example, phenyloxy, 1-naphthyloxy, and 2-naphthyloxy), a heteroaryloxy group (preferably having from 1 to 30 carbon atoms, more preferably from 1 to 20 carbon atoms, and especially preferably from 1 to 12 carbon atoms; for example, pyridyloxy, pyrazinyloxy, pyrimidyloxy, and quinolyloxy), an acyl group (preferably having from 1 to 30 carbon atoms, more preferably from 1 to 20 carbon atoms, and especially preferably from 1 to 12 carbon atoms; for example, acetyl, benzoyl, formyl, and pivaloyl), an alkoxycarbonyl group (preferably having from 2 to 30 carbon atoms, more preferably from 2 to 20 carbon atoms, and especially preferably from 2 to 12 carbon atoms; for example, methoxycarbonyl and ethoxycarbonyl), an aryloxycarbonyl group (preferably having from 7 to 30 carbon atoms, more preferably from 7 to 20 carbon atoms, and especially preferably from 7 to 12 carbon atoms; for example, phenyl-oxycarbonyl), an acyloxy group (preferably having from 2 to 30 carbon atoms, more preferably from 2 to 20 carbon atoms, and especially preferably from 2 to 10 carbon atoms; for example, acetoxy and benzoyloxy), an acylamino group (preferably having from 2 to 30 carbon atoms, more preferably from 2 to 20 carbon atoms, and especially preferably from 2 to 10 carbon atoms; for example, acetylamino and benzoylamino), an alkoxycarbonylamino group (preferably having from 2 to 30 carbon atoms, more preferably from 2 to 20 carbon atoms, and especially preferably from 2 to 12 carbon atoms; for example, methoxycarbonylamino), an aryloxycarbonylamino group (preferably having from 7 to 30 carbon atoms, more preferably from 7 to 20 carbon atoms, and especially preferably from 7 to 12 carbon atoms; for example, phenoxyloxycarbonylamino), a sulfonylamino group (preferably having from 1 to 30 carbon atoms, more preferably from 1 to 20 carbon atoms, and especially preferably from 1 to 12 carbon atoms; for example, methylsulfonylamino and phenylsulfonylamino), a sulfamoyl group (preferably having from 0 to 30 carbon atoms, more preferably from 0 to 20 carbon atoms, and especially preferably from 0 to 12 carbon atoms; for example, sulfamoyl, methylsulfamoyl, dimethylsulfamoyl, and phenylsulfamoyl), a carbamoyl group (preferably having from 1 to 30 carbon atoms, more preferably from 1 to 20 carbon atoms, and especially preferably from 1 to 12 carbon atoms; for example, carbamoyl, methylcarbamoyl, diethylcarbamoyl, and phenylcarbamoyl), an alkylthio group (preferably having from 1 to 30 carbon atoms, more preferably from 1 to 20 carbon atoms, and especially preferably from 1 to 12 carbon atoms; for example, methylthio and ethylthio), an arylthio group (preferably having from 6 to 30 carbon atoms, more preferably from 6 to 20 carbon atoms, and especially preferably from 6 to 12 carbon atoms; for example, phenylthio), a heteroarylthio group (preferably having from 1 to 30 carbon atoms, more preferably from 1 to 20 carbon atoms, and especially preferably from 1 to 12 carbon atoms; for example, pyridylthio, 2-benzimidazolylthio, 2-benzoxazolylthio, and 2-benzthiazolylthio), a sulfonyl group (preferably having from 1 to 30 carbon atoms, more preferably from 1 to 20 carbon atoms, and especially preferably from 1 to 12 carbon atoms; for example, mesyl and tosyl), a sulfinyl group (preferably having from 1 to 30 carbon atoms, more preferably from 1 to 20 carbon atoms, and especially preferably from 1 to 12 carbon atoms; for example, methanesulfinyl and benzenesulfinyl), an ureido group (preferably having from 1 to 30 carbon atoms, more preferably from 1 to 20 carbon atoms, and especially preferably from 1 to 12 carbon atoms; for example, ureido, methylureido, and phenylureido), a phosphoric amide group (preferably having from 1 to 30 carbon atoms, more preferably from 1 to 20 carbon atoms, and especially preferably from 1 to 12 carbon atoms; for example, diethylphosphoric amide and phenylphosphoric amide), a hydroxy group, a mercapto group, a halogen atom (for example, a fluorine atom, a chlorine atom, a bromine atom, and an iodine atom), a cyano group, a sulfo group, a carboxyl group, a nitro group, a hydroxamic acid group, a sulfino group, a hydrazino group, an imino group, a heterocyclic group (preferably having from 1 to 30 carbon atoms, and more preferably from 1 to 12 carbon atoms; examples of the hetero atom include a nitrogen atom, an oxygen atom, and a sulfur atom; and specific examples thereof imidazolyl, pyridyl, quinolyl, furyl, thienyl, piperidyl, morpholino, benzoxazolyl, benzimidazolyl, and benzthiazolyl), and a silyl group (preferably having from 3 to 40 carbon atoms, more preferably from 3 to 30 carbon atoms, and especially preferably from 3 to 24 carbon atoms; for example, tri-methylsilyl and triphenylsilyl).

As the nitrogen-containing heteroaryl 6-membered ring and its fused ring, pyrazine, pyrimidine, pyridazine, triazine, quinoxaline, quanozoline, phthalazine, and cinnoline are preferable.

In formulae (2) and (22), $Z^{201}$ represents an optionally substituted atomic group for forming an aryl ring or a heteroaryl ring. The aryl ring formed by $Z^{201}$ preferably has from 6 to 30 carbon atoms, more preferably from 6 to 20 carbon atoms, and especially preferably from 6 to 12 carbon atoms. Examples thereof include a phenyl group, a naphthyl group, an anthryl group, a phenanthryl group, and a pyrenyl group. Further, the aryl ring formed by $Z^{201}$ may form a fused ring together with a carbon ring or a hetero ring. The heteroaryl ring formed by $Z^{201}$ preferably represents a heteroaryl group composed of a carbon atom, a nitrogen atom, an oxygen atom, or a sulfur atom, and more preferably a 5-membered or 6-membered heteroaryl ring. Further, the heteroaryl ring formed by $Z^{201}$ may form a fused ring. The heteroaryl ring formed by $Z^{201}$ preferably has from 2 to 30 carbon atoms, more preferably from 2 to 20 carbon atoms, and especially preferably from 2 to 10 carbon atoms. Examples thereof include pyrazine, pyrimidine, pyridazine, triazine, quinoxaline, quinazoline, phthalazine, cinnoline, perimidine, phenanthroline, pyrrole, imidazole, pyrazole, oxazole, oxadiazole, triazole, thiadiazole, benzimidazole, benzoxazole, benzthiazole, phenanthridine, a thienyl group, and a furyl group. The ring formed by $Z^{201}$ is preferably an aryl group.

In formula (22), $L^{202}$ represents a ligand. Examples of the ligand include ligands necessary for forming an orthometalated iridium complex and other ligands.

The term "orthometalated metal complex" as referred to herein is a general term of the group of compounds described in, for example, Akio Yamamoto, *Yukikinzoku-Kagaku, Kiso to Oyo* (Metalorganic Chemistry, Foundation and Application), pp. 150-232, published by Shokabo Publishing Co., Ltd. (1982); and H. Yersin, *Photochemistry and Photophysics of Coordination Compounds*, pp. 71-77 and pp. 135-146, published by Springer-Verlag (1987).

Though the valence of iridium of the orthometalated iridium complex is not particularly limited, it is preferably trivalent. The ligand of the orthometalated iridium complex is not particularly limited so far as it can form an orthometalated complex. Examples thereof include aryl group-substituted nitrogen-containing heterocyclic derivatives (the aryl group is substituted on carbon adjacent to the nitrogen atom of the nitrogen-containing hetero ring; examples of the aryl group include a phenyl group, a naphthyl group, an anthracenyl group, and a pyrenyl group; and examples of the nitrogen-containing hetero ring include pyridine, pyrimidine, pyrazine, pyridazine, quinoline, isoquinoline, quinoxaline, phthaladine, quinazoline, naphtholidine, cinnoline, perimidine, phenanthroline, pyrrole, imidazole, pyrazole, oxazole, oxadiazole, triazole, thiadiazole, benzimidazole, benzoxazole, benzthiazole, and phen-anthridine), heteroaryl group-substituted nitrogen-containing heterocyclic derivatives (the heteroaryl group is substituted on carbon adjacent to the nitrogen atom of the nitrogen-containing hetero ring; and examples of the heteroaryl group include groups containing the foregoing nitrogen-containing heterocylic derivatives, a thiophenyl group, and a furyl group), 7,8-benzoquinoline derivatives, phosphinoaryl derivatives, phosphinoheteroaryl derivatives, phosphinoxyaryl derivatives, phosphinoxyheteroaryl derivatives, aminomethylaryl derivatives, and aminomethylheteroaryl derivatives. Of these, aryl group-substituted nitrogen-containing aromatic heterocyclic derivatives, heteroaryl group-substituted nitrogen-containing aromatic heterocyclic derivatives, and 7,8-benzoquinoline derivatives are preferable; phenylpyridine derivatives, thiophenylpyridine derivatives, and 7,8-benzoquinoline derivatives are further preferable; and thiophenylpyridine derivatives and 7,8-benzoquinoline derivatives are especially preferable.

The iridium complex of the invention may have other ligand than the ligand necessary for forming an orthometalated complex. As other ligand, various known ligands are useful. Examples thereof include ligands described in H. Yersin, *Photochemistry and Photophysics of Coordination Compounds,* published by Springer-Verlag (1987); and Akio Yamamoto, *Yukikinzoku-Kagaku, Kiso to Oyo* (Metalorganic Chemistry, Foundation and Application), published by Shokabo Publishing Co., Ltd. (1982). Of these, halogen ligands (preferably a chlorine ligand), nitrogen-containing heterocyclic ligands (for example, bipyridyl and phenanthroline), and diketone ligands are preferable; and a chlorine ligand and a bipyridyl ligand are more preferable.

The kind of the ligand of the iridium complex of the invention may be single or plural. The number of ligands in the complex is preferably from 1 to 3, more preferably 1 or 2, and especially preferably 1.

$n^{202}$ represents an integer of from 0 to 5; $m^{202}$ represents 1, 2 or 3; and the combination of $n^{202}$ and $m^{202}$ is preferably a combination of the number upon which the Ir complex becomes a neutral complex.

Next, the Ir complex having a partial structure represented by formula (3) will be described below in detail.

The Ir complex having a partial structure represented by formula (3) can be specifically represented by the following formula (23):

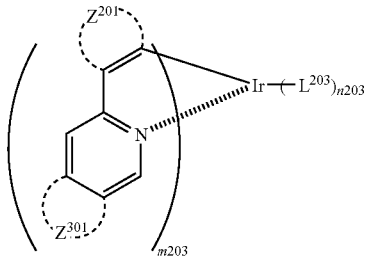

In formulae (3) and (23), $Z^{201}$ is synonymous with that described in formula (2).

In formulae (3) and (23), $Z^{301}$ represents an atomic group for forming an aryl ring or a heteroaryl ring to be fused with the pyridine ring; and the aryl ring or the heteroaryl ring to be formed is the same as the aryl ring or the heteroaryl ring formed by $Z^{201}$ in formulae (2) and (22). The ring formed by $Z^{301}$ is preferably an aryl ring.

In formula (23), $L^{203}$, $n^{203}$, and $m^{203}$ are synonymous with $L^{202}$, $n^{202}$, and $m^{202}$ in formula (22), respectively.

Next, the Ir complex having a partial structure represented by formula (4) will be described below in detail.

The Ir complex having a partial structure represented by formula (4) can be specifically represented by the following formula (24):

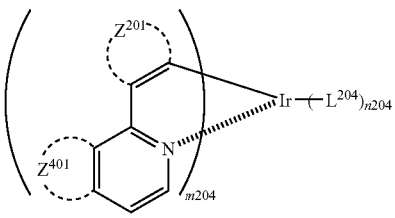

In formulae (4) and (24), $Z^{201}$ is synonymous with that described in formula (2).

In formulae (4) and (24), $Z^{401}$ represents an atomic group for forming an aryl ring or a heteroaryl ring to be fused with the pyridine ring; and the aryl ring or heteroaryl ring to be formed is the same as the aryl ring or heteroaryl ring formed by $Z^{201}$ in formulae (2) and (22). The ring formed by $Z^{401}$ is preferably an aryl ring.

In formula (24), $L^{204}$, $n^{204}$, and $m^{204}$ are synonymous with $L^{202}$, $n^{202}$, and $m^{202}$ in formula (22), respectively.

Next, the Ir complex having a partial structure represented by formula (5) will be described below in detail.

The Ir complex having a partial structure represented by formula (5) can be specifically represented by the following formula (25):

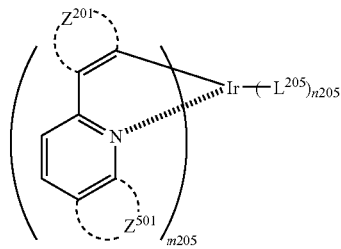

In formulae (5) and (25), $Z^{201}$ is synonymous with that described in formula (2).

In formulae (5) and (25), $Z^{501}$ represents an atomic group for forming an aryl ring or a heteroaryl ring to be fused with the pyridine ring; and the aryl ring or heteroaryl ring to be formed is the same as the aryl ring or heteroaryl ring formed by $Z^{201}$ in formulae (2) and (22). The ring formed by $Z^{501}$ is preferably an aryl ring.

In formula (25), $L^{205}$, $n^{205}$, and $m^{205}$ are synonymous with $L^{202}$, $n^{202}$, and $m^{202}$ in formula (22), respectively.

Next, specific examples of the compound which is used in the invention will be given below, but it should not be construed that the invention is limited thereto.

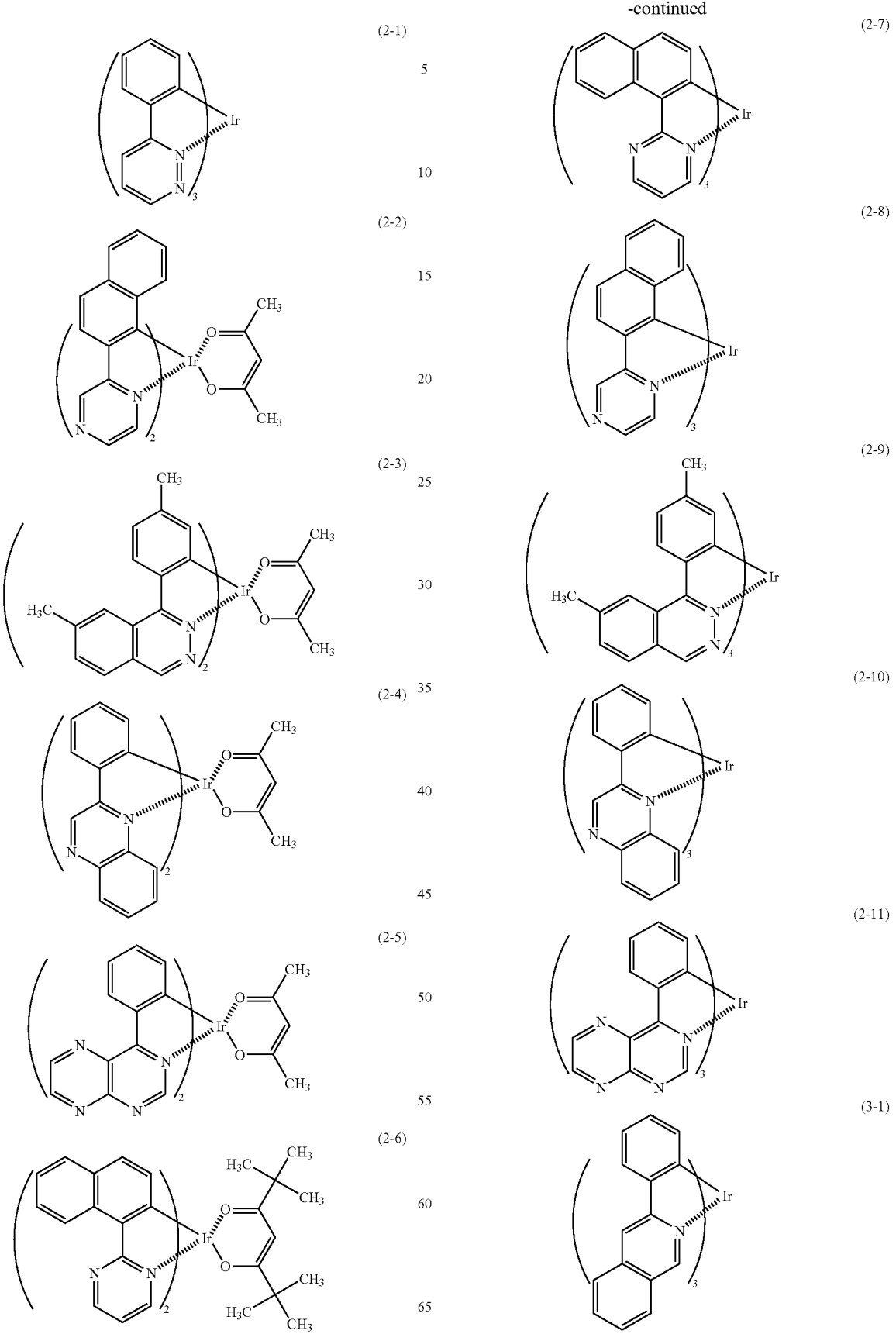

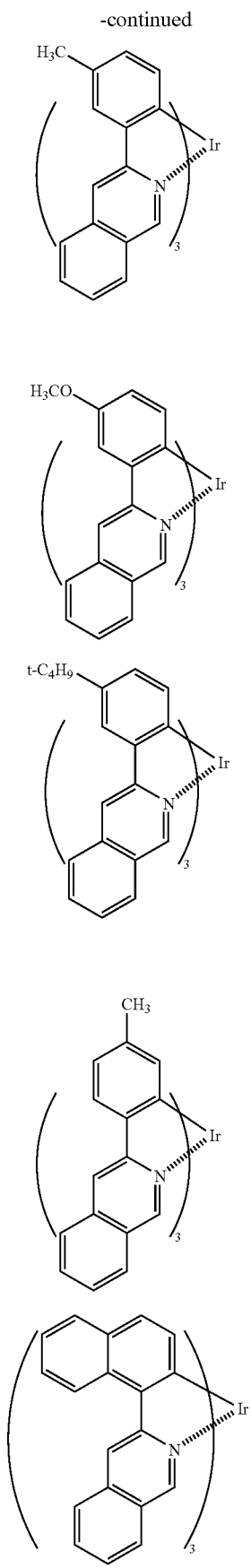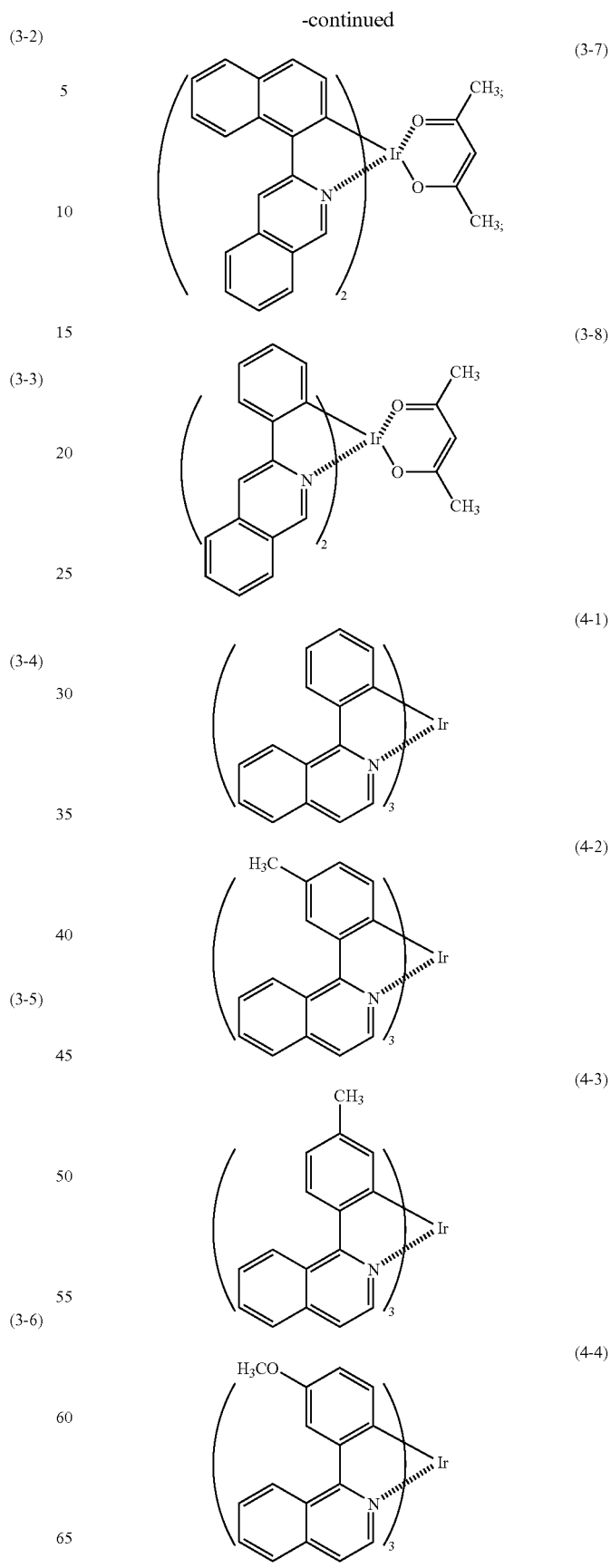

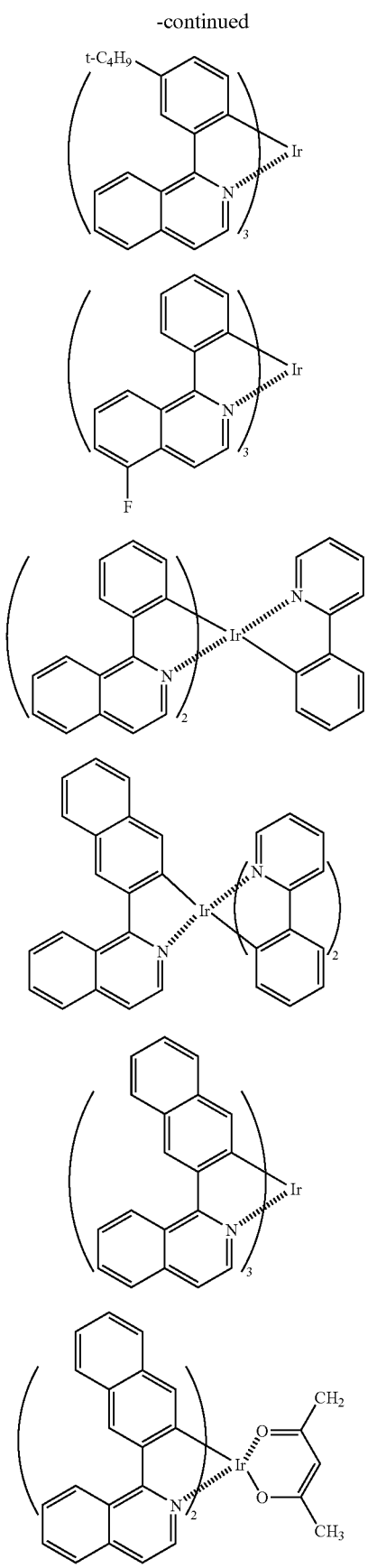
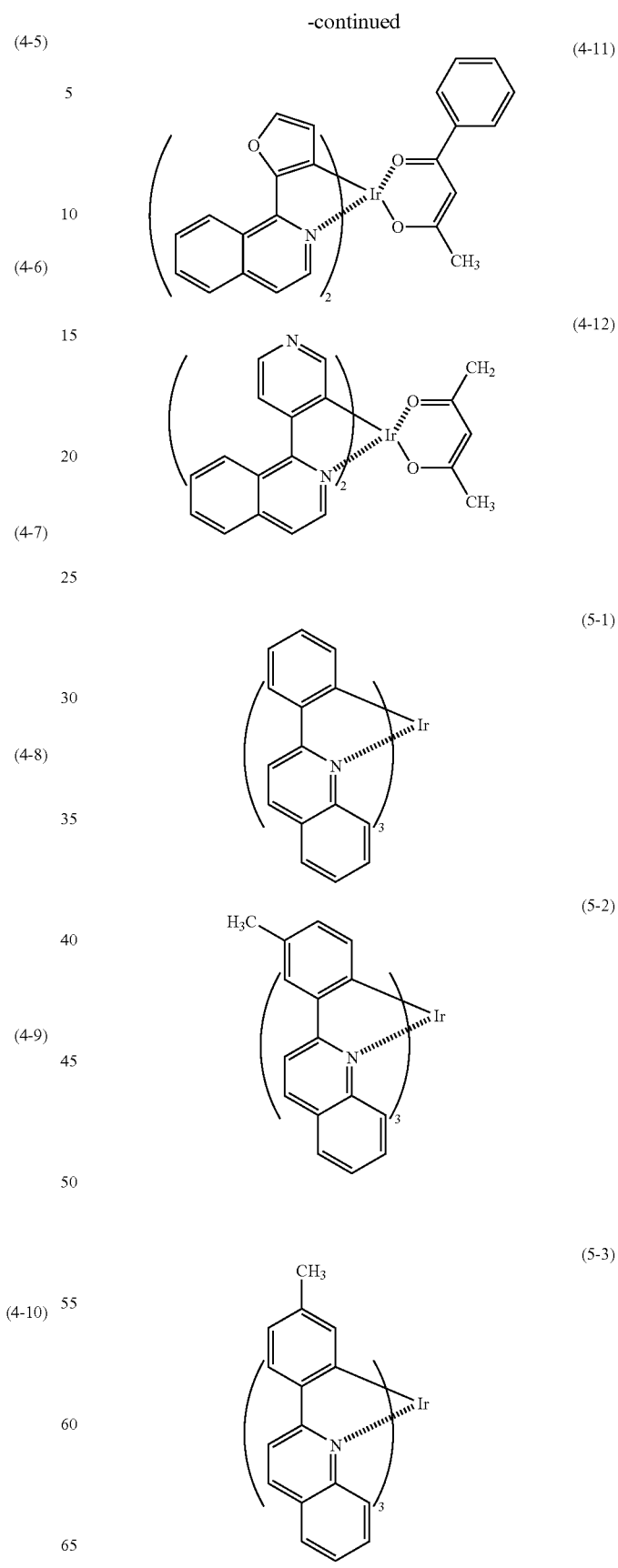

-continued

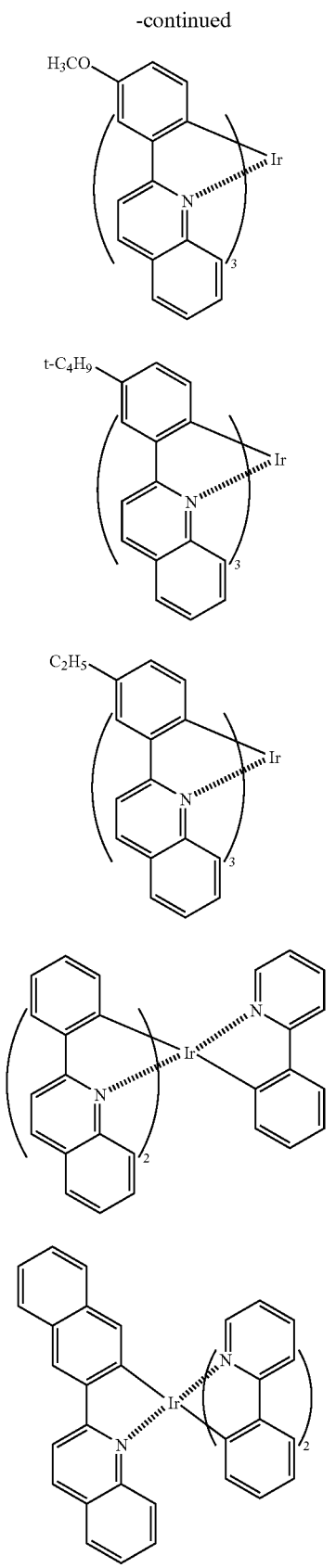

(5-4)
(5-5)
(5-6)
(5-7)
(5-8)

-continued

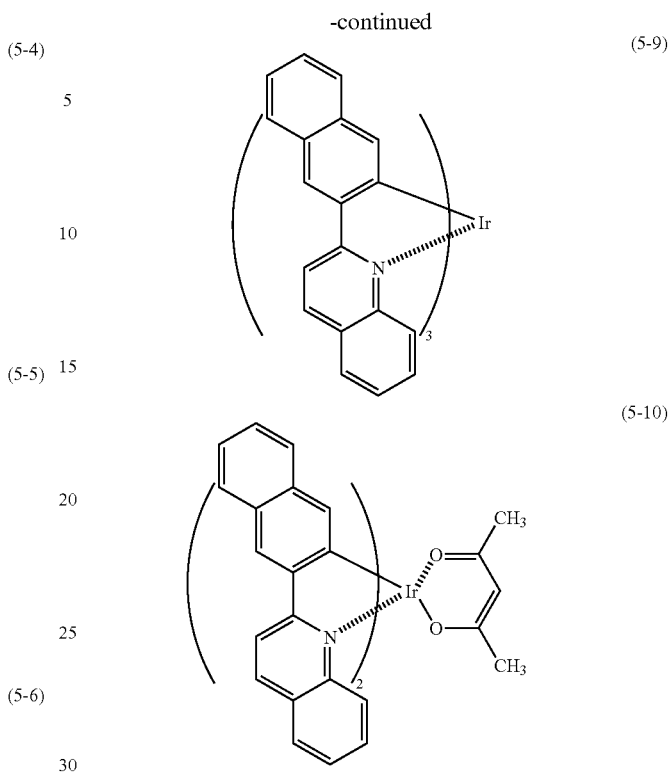

(5-9)
(5-10)

Of these, compounds (3-1) and (4-1) are the most preferable.

The five-coordinate metal complex as the host material which is used in the light emitting layer will be described blow.

As the central metal of the five-coordinate metal complex, Al, Ga, In, and the like can be selected. Of these, Al and Ga are preferable; and Al is more preferable.

As the five-coordinate Al complex, for example, compounds enumerated in JP-A-2001-284056 can be suitably used. Also, as the five-coordinate Ga complex, for example, compounds enumerated in JP-A-2003-142264 can be suitably used.

As the five-coordinate metal complex, a compound represented by formula (101) can be preferably used.

In formula (101), M represents Al, Ga, or In; $R_3$ to $R_8$ each independently represents a hydrogen atom, an alkyl group, or an alkoxy group; A represents —O—Ar or a halogen atom; and Ar represents an optionally substituted aryl group.

The alkyl group preferably has from 1 to 30 carbon atoms, more preferably from 1 to 20 carbon atoms, and especially preferably from 1 to 10 carbon atoms; and examples thereof include methyl, ethyl, isopropyl, tert-butyl, n-octyl, n-decyl, n-hexadecyl, cyclopropyl, cyclopentyl, and cyclohexyl. The alkoxy group preferably has from 1 to 30 carbon atoms, more preferably from 1 to 20 carbon atoms, and especially preferably from 1 to 10 carbon atoms; and examples thereof include methoxy, ethoxy, butoxy, and 2-ethylhexyloxy. The aryl group preferably has from 6 to 30 carbon atoms, more preferably from 6 to 20 carbon atoms, and especially preferably from 6 to 12 carbon atoms; and examples thereof include phenyl, p-methylphenyl, naphthyl, and anthranyl. Examples of the halogen atom include a fluorine atom, a chlorine atom, a bromine atom, and an iodine atom. Examples of the substituent which Ar optionally have include the same as the substituent represented by R in formula (2) or (22).
Specific examples of the compound represented by formula (101) will be given below.
(1)
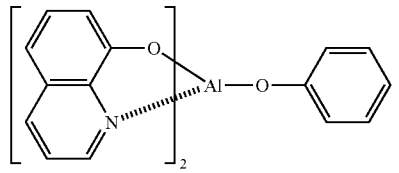
(2)
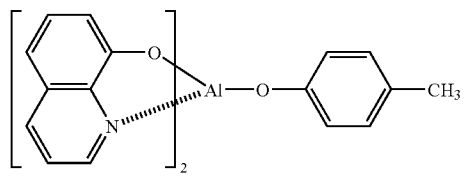
(3)
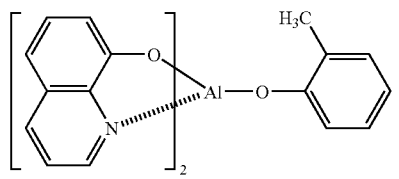
(4)
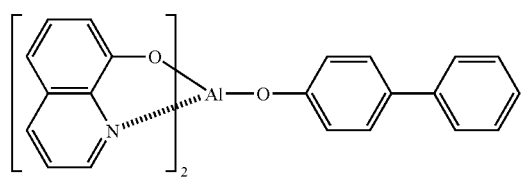
(5)
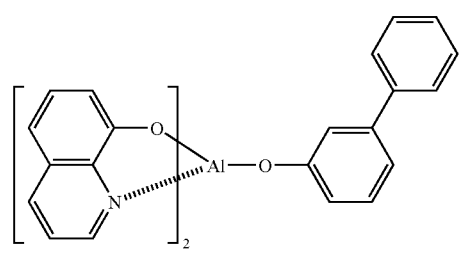
(6)
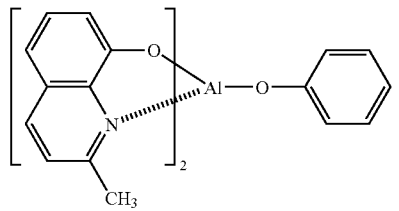
(7)
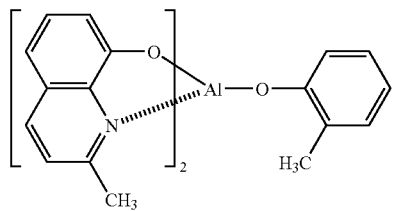
-continued
(8)
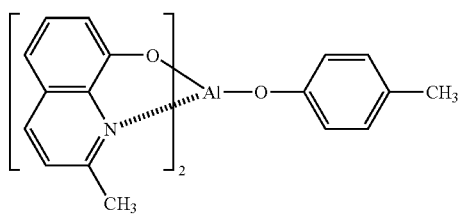
(9)
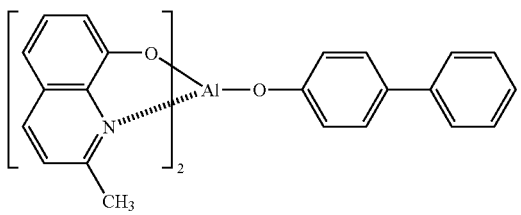
(10)
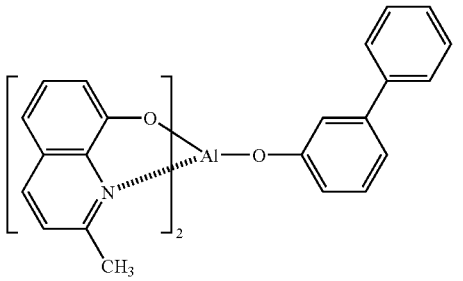
(11)
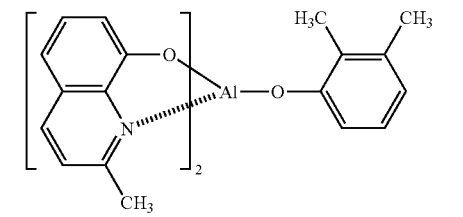
(12)
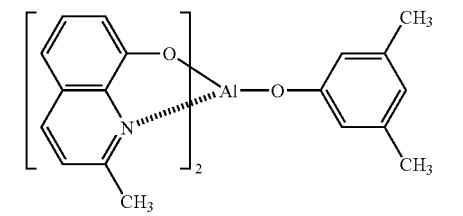
(13)
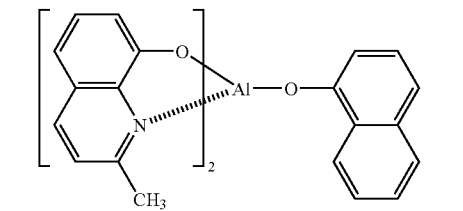
(14)
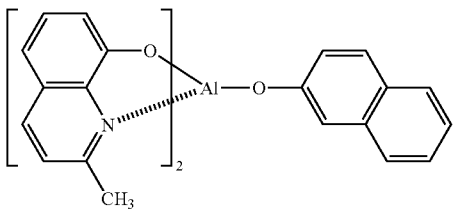

-continued
(15)
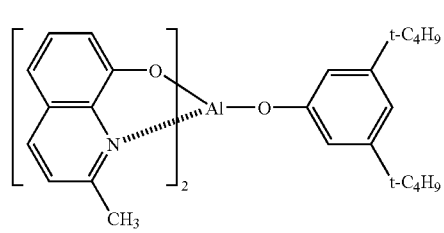
(16)
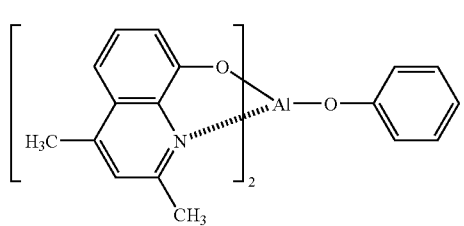
(17)
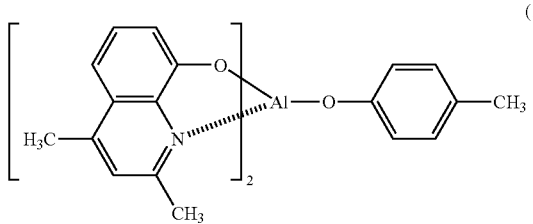
(18)
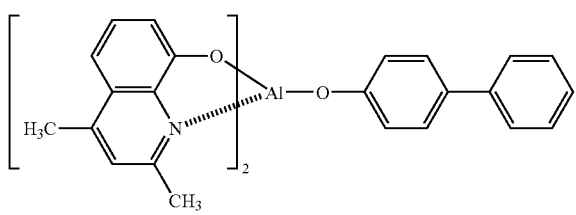
(19)
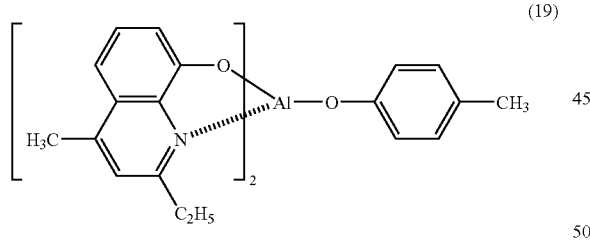
(20)
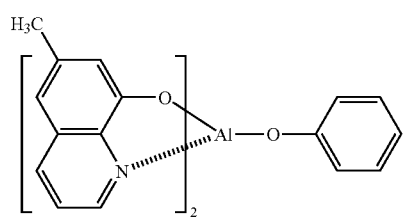
(21)
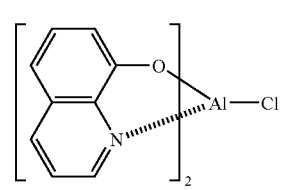
-continued
(22)
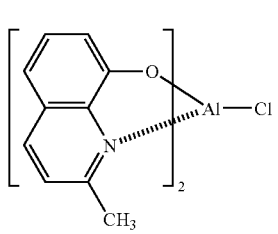
(23)
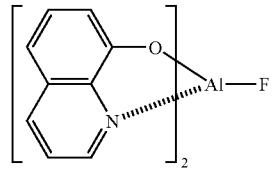
(24)
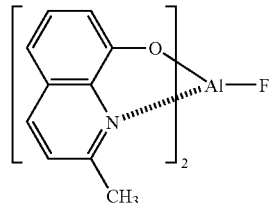
(25)
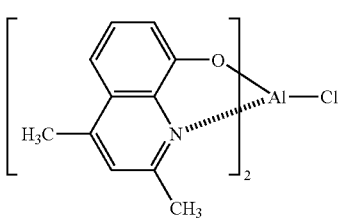
(26)
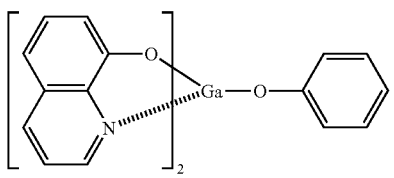
(27)
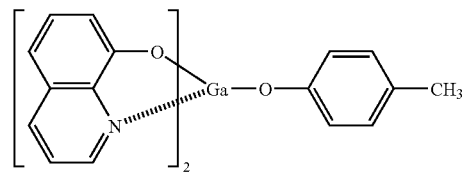
(28)
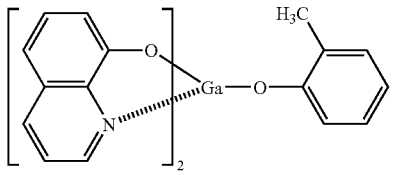
(29)
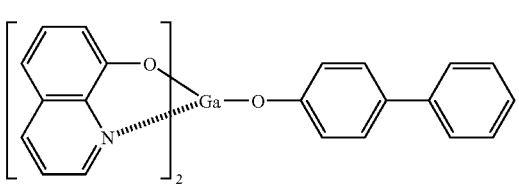

-continued
(30)
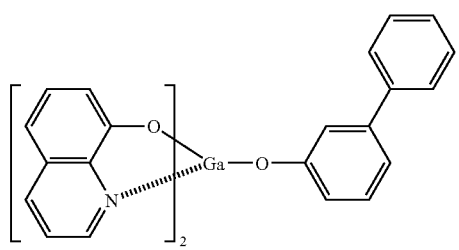
(31)
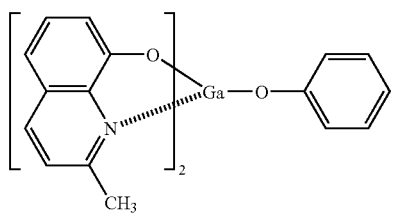
(32)
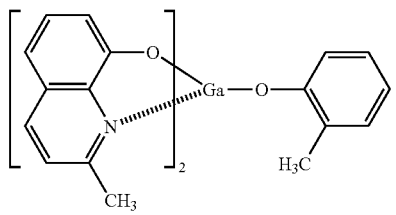
(33)
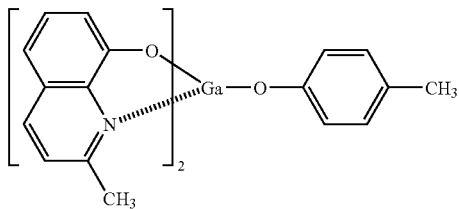
(34)
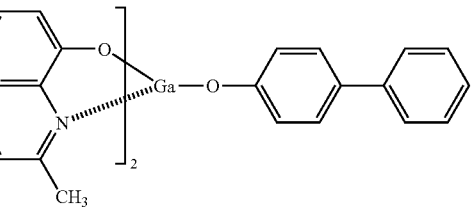
(35)
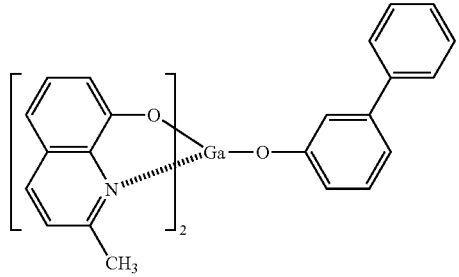
(36)
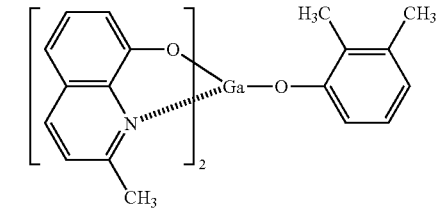
-continued
(37)
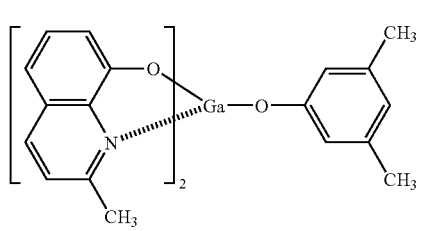
(38)
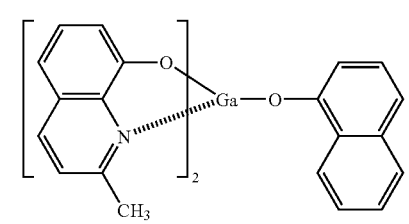
(39)
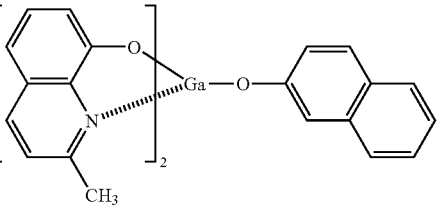
(40)
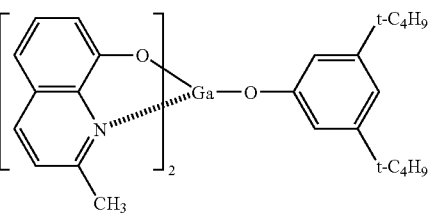
(41)
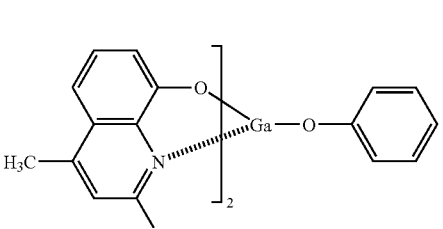
(42)
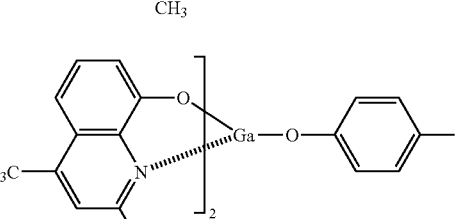
(43)
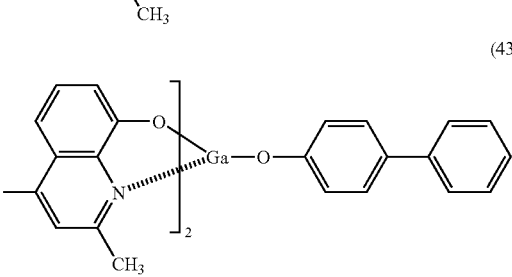

-continued

(44) 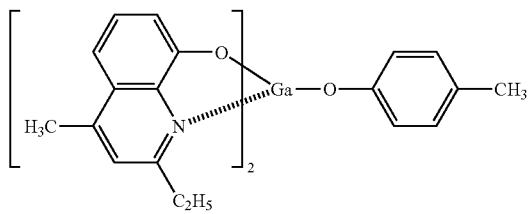

(45) 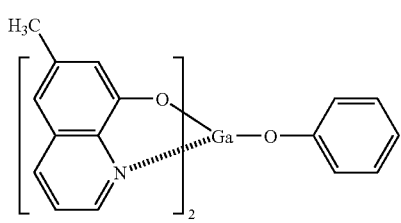

(46) 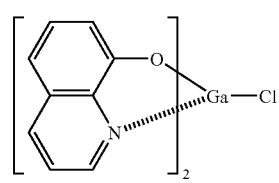

(47) 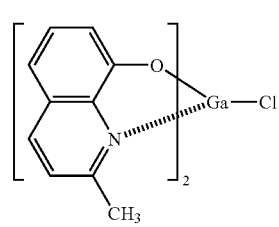

(48) 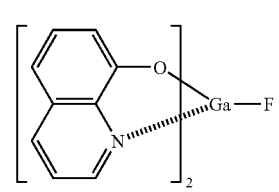

(49) 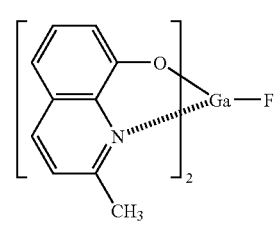

(50) 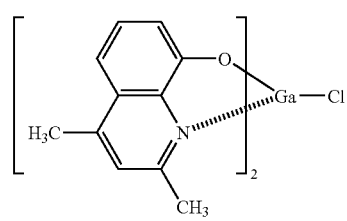

-continued

(51) 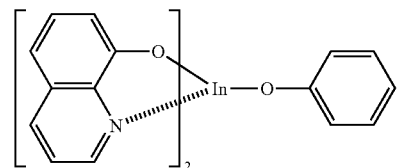

(52) 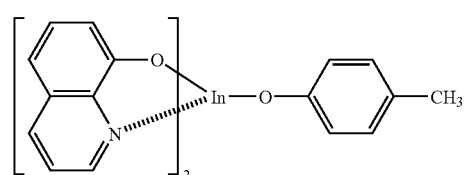

(53) 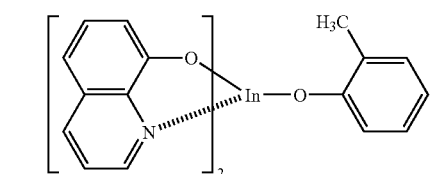

(54) 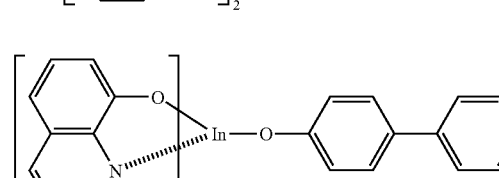

(55) 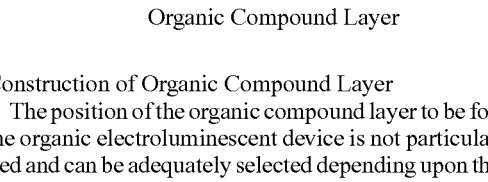

Of these, Balq$_2$ (i.e., compound (9)) is the most preferable from the standpoints of an enhancement of durability and an enhancement of luminous efficiency.

The organic electroluminescent device of the invention will be described below in detail.

Organic Compound Layer

Construction of Organic Compound Layer

The position of the organic compound layer to be formed in the organic electroluminescent device is not particularly limited and can be adequately selected depending upon the application and purpose of the organic electroluminescent device. But, it is preferable that the organic compound layer is formed on a transparent electrode or a back electrode (i.e., on an anode or a cathode). In this case, the organic compound layer is formed entirely or partially on the surface of the transparent electrode or on the surface of the back electrode.

The shape, size, thickness, etc. of the organic compound layer are not particularly limited and can be adequately selected depending upon the purpose.

Specific examples of the organic compound layer construction including electrodes (i.e., anode and cathode) include anode/hole transporting layer/light emitting layer/ electron transporting layer/cathode, anode/hole transporting layer/light emitting layer/block layer/electron transporting layer/cathode, anode/hole transporting layer/light emitting layer/block layer/electron transporting layer/electron injection layer/cathode, anode/hole injection layer/hole transporting layer/light emitting layer/block layer/electron transporting layer/cathode, and anode/hole injection layer/hole transporting layer/light emitting layer/block layer/electron transporting layer/electron injection layer/cathode. However, it should not be construed that the invention is limited thereto.

Hole Transporting Layer

The hole transporting layer which is used in the invention contains a hole transporting material. As the hole transporting material, any material can be used without particular limitations so far as it has either a function to transport a hole or a function to block an electron injected from the cathode, and all of low molecular hole transporting materials and high molecular hole transporting materials can be used. Examples thereof include as follows.

That is, examples of the hole transporting material include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, polysilane compounds, conductive high molecular oligomers such as poly(N-vinylcarbazole) derivatives, aniline copolymers, thiophene oligomers, and polythiophenes; and high molecular compounds such as polythiophene derivatives, polyphenylene derivatives, polyphenylenevinylene derivatives, and polyfluorene derivatives. These compounds may be used singly or in combinations of two or more kinds thereof.

The thickness of the hole transporting layer is preferably from 10 to 200 nm, and more preferably from 20 to 80 nm. When the thickness of the hole transporting layer exceeds 200 nm, the drive voltage may possibly increase. On the other hand, when it is less than 10 nm, the organic electroluminescent device may possibly cause short circuit.

In the invention, it is possible to provide a hole injection layer between the hole transporting layer and the anode.

The hole injection layer as referred to herein is a layer for making it easy to inject a hole from the anode into the hole transporting layer. Specifically, of the hole transporting materials, materials having a low ionization potential are suitably used. Examples of the material which can be suitably used include phthalocyanine compounds, porphyrin compounds, and starburst triarylamine compounds.

The thickness of the hole injection layer is from 1 to 30 nm.

Light Emitting Layer

The light emitting layer which is used in the invention contains a host material and a phosphorescent material, the host material is a five-coordinate metal complex, and the phosphorescent material is at least one Ir complex having a partial structure represented by any one of the foregoing formulae (2) to (5).

In the invention, besides the five-coordinate metal complex, other host materials may be added as the host material.

The host compound as referred to herein is a compound having a function to undergo energy transfer into the fluorescent material or phosphorescent material from the host compound in the excited state, resulting in undergoing of light emission from the fluorescent material or phosphorescent material.

As the other host materials, any compound capable of undergoing energy transfer of exciton energy into a light emitting material can be adequately selected without particular limitations depending upon the purpose. Examples thereof include metal complexes of carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcon derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, anthraquinodimethane derivatives, anthrone derivatives, diphenylquinone derivatives, thiopyrane dioxide derivatives, carbodiimide derivatives, fluorenylidenemethane derivatives, distyrylpyrazine derivatives, heterocyclic tetracarboxylic anhydrides such as naphthaleneperylene; phthalocyanine derivatives, various typified by metal complexes of 8-quinolinol derivatives, metal phthalocyanines or metal complexes having benzoxazole, or benzothiazole as a ligand; polysilane compounds, conductive high molecular oligomers such as poly(N-vinylcarbazole) derivatives, aniline based copolymers, thiophene oligomers, and polythiophenes; and high molecular compounds such as polythiophene derivatives, polyphenylene derivatives, polyphenylenevinylene derivatives, and polyfluorene derivatives.

In the invention, in addition to the Ir complexes having a partial structure represented by any one of formulae (2) to (5), other light emitting materials may be contained.

The other light emitting materials which are used in the invention are not particularly limited, and any material can be used so far as it is a fluorescent material or a phosphorescent material.

Examples of the fluorescent light emitting compound include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyrralizine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidene derivatives, various metal complexes typified by metal complexes of 8-quinolyl derivatives and rare earth metal complexes; high molecular compounds such as polythiophene derivatives, polyphenylene derivatives, polyphenylenevinylene derivatives, and polyfluorene derivatives. These compounds can be used singly or in admixture of two or more kinds thereof.

The phosphorescent material is not particularly limited, but orthometalated metal complexes and porphyrin metal complexes are preferable.

The ratio of the host material to the light emitting material to be used in the invention is from 99.9/0.1 to 50/50, preferably from 99.5/0.5 to 70/30, and more preferably from 99.0/1.0 to 80/20 on a weight basis.

The thickness of the light emitting layer of the invention is preferably from 10 to 200 nm, and more preferably from 20 to 80 nm. When the thickness of the light emitting layer exceeds 200 nm, the drive voltage may possibly increase. On the other hand, when it is less than 10 nm, the organic electroluminescent device may possibly cause short circuit.

Block Layer

In the invention, it is possible to provide a block layer between the light emitting layer and the electron transporting layer. The block layer as referred to herein is a layer for suppressing diffusion of an exciton formed in the light emitting layer and is also a layer for suppressing punch-through of the pole into the cathode side.

As the material to be used in the block layer, any material which can receive an electron from the electron transporting layer and transfer it into the light emitting layer can be used without particular limitations, and general electron transporting materials can be used. Examples of the material include metal complexes of triazole derivatives, oxazole derivatives, oxadiazole derivatives, fluorenone derivatives, anthraquinodimethane derivatives, anthrone derivatives, diphenylquinone derivatives, thiopyrane dioxide derivatives, carbodiimide derivatives, fluorenylidenemethane derivatives, distyrylpyrazine derivatives, heterocyclic tetracarboxylic anhydrides such as naphthaleneperylene; phthalocyanine derivatives, various metal complexes typified by metal complexes of 8-quinolinol derivatives, metal phthalocyanine or metal complexes having benzoxazole, or benzothiazole as a ligand; conductive high molecular oligomers such as aniline based copolymers, thiophene oligomers, and polythiophenes; and high molecular compounds such as polythiophene derivatives, polyphenylene derivatives, polyphenylenevinylene derivatives, and polyfluorene derivatives. These compounds may be used singly or in combinations of two or more kinds thereof.

Electron Transporting Layer

In the invention, it is possible to provide an electron transporting layer containing an electron transfer material.

As the electron transporting material, any material can be used without particular limitations so far as it has either a function to transport an electron or a function to block a hole injected from the anode, and the electron transporting materials enumerated in the foregoing description of the block layer can be suitably used.

The thickness of the electron transporting layer is preferably from 10 to 200 nm, and more preferably from 20 to 80 nm.

When the thickness of the electron transporting layer exceeds 200 nm, the drive voltage may possibly increase. On the other hand, when it is less than 10 nm, the organic electroluminescent device may possibly cause short circuit.

In the invention, it is possible to provide an electron injection layer between the electron transporting layer and the cathode.

The electron injection layer as referred to herein is a layer for making it easy to inject an electron from the cathode into the electron transporting layer. Specifically, lithium salts such as lithium fluoride, lithium chloride, and lithium bromide; alkali metal salts such as sodium fluoride, sodium chloride, and cesium fluoride; insulating metal oxides such as lithium oxide, aluminum oxide, indium oxide, and magnesium oxide; and the like can be suitably used.

The thickness of the electron injection layer is from 0.1 to 5 nm.

Formation of Organic Compound Layer

The organic compound layer can be suitably subjected to film formation by any of the dry film formation process (for example, vapor deposition process and sputtering process) and the wet film formation process (for example, dipping, spin coating process, dip coating process, casting process, die coating process, roll coating process, bar coating process, and gravure coating process).

Of these, the dry process is preferable from the standpoints of luminous efficiency and durability.

Substrate

As a material of the substrate, materials which do not permeate moisture or materials having an extremely low permeability of moisture are preferable. Also, materials which do not scatter and/or decay light emitted from the organic compound layer are preferable. Examples thereof include inorganic materials such as YSZ (yttrium stabilized zirconia) and glass; and organic materials such as polyesters (for example, polyethylene terephthalate, polybutylene terephthalate, and polyethylene naphthalate) and synthetic resins (for example, polystyrene, polycarbonates, polyether sulfones, polyacrylates, allyl diglycol carbonates, polyimides, polycycloolefins, norbornene resins, and poly(chlorotrifluoroethylene)). In the case of the organic material, it is preferable that the material is excellent with respect to heat resistance, dimensional stability, solvent resistance, electric insulating properties, processability, low air permeability, low hygroscopicity, etc. Of these, in the case where the material of the transparent electrode is indium tin oxide (ITO) which is suitably used as the transparent electrode, materials having a small difference in lattice constant from the indium tin oxide (ITO) are preferable. These materials may be used singly or in combinations with two or more kinds thereof.

The substrate is not particularly limited with respect to the shape, structure, size, etc. and can be adequately selected depending upon the application, purpose, etc. of the organic electroluminescent device. In general, the shape may be a plate-like shape. The structure may be a single-layered structure or a laminated structure, and the substrate may be made of a single material or two or more materials.

The substrate may be colorless and transparent, or may be colored and transparent. However, a colorless and transparent substrate is preferable from the standpoint that it does not scatter or decay the light emitted from the light emitting layer.

It is preferable that the substrate is provided with an antpermeable layer (or gas barrier layer) on the front surface or rear surface (or in the transparent electrode side).

As a material of the anti-permeable layer (or gas barrier layer), inorganic materials such as silicon nitride and silicon oxide are suitably used. The anti-permeable layer (or gas barrier layer) can be formed by, for example, the high-frequency sputtering process.

If desired, the substrate maybe provided with a hard coat layer, an undercoat layer, etc.

Anode

As the anode, in general, any material having a function as an anode to feed a hole into the organic compound layer may be employed and is not particularly limited with respect to the shape, structure, size, etc. It can be adequately selected among known electrodes depending upon the application and purpose of the organic electroluminescent device.

As a material of the anode, for example, metals, alloys, metal oxides, organic conductive compounds, and mixtures thereof are suitably enumerated. Of these, materials having a work function of 4.0 eV or more are preferable. Specific examples thereof include semiconducting metal oxides such as tin oxide doped with antimony, fluorine, etc. (ATO or FTO), tin oxide, zinc oxide, indium oxide, indium tin oxide (ITO), and indium zinc oxide (IZO); metals such as gold, silver, chromium, and nickel; mixtures or laminates of these metals with conductive metal oxides; inorganic conductive substances such as copper iodide and copper sulfide; organic conductive materials such as polyaniline, polythiophene, and polypyrrole; and laminates thereof with ITO.

It is possible to form the anode on the substrate according to a method which is adequately selected among wet systems (for example, printing system and coating system), physical systems (for example, vacuum vapor deposition process, sputtering process, and ion plating process), and chemical systems (for example, CVD and plasma CVD process) while taking into consideration adaptivity with the foregoing material. For example, in the case where ITO is selected as the material of the anode, the formation of the anode can be carried out according to the direct current or high-frequency sputtering process, the vacuum vapor deposition process, the ion plating process, etc. Also, in the case where an organic conductive compound is selected as the material of the anode, the formation of the anode can be carried out according to the wet film formation process.

The position at which the anode is formed in the organic electroluminescent device is not particularly limited and can be adequately selected depending upon the application and purpose of the organic electroluminescent device. However, it is preferable that the anode is formed on the substrate.

In this case, the anode may be formed entirely or partially on the one surface of the substrate.

The patterning of the anode may be carried out by chemical etching by photolithography, etc. or physical etching using laser, etc. Also, the patterning of the anode may be carried out by vacuum vapor deposition or sputtering by superimposing a mask, or may be carried out by the lift-off process or the printing process.

The thickness of the anode can be adequately selected depending upon the foregoing material. Though the thickness of the anode cannot be unequivocally defined, it is usually from 10 nm to 50 μm, and preferably from 50 nm to 20 μm.

The resistance value of the anode is preferably not more than $10^3$ Ω/□, and more preferably not more than $10^2$ Ω/□.

The anode may be colorless and transparent, or may be colored and transparent. In order to take out light emission from the anode side, its transmittance is preferably 60% or more, and more preferably 70% or more. This transmittance can be measured according to a known method using a spectrophotometer.

The anode is described in detail in *Tomei-Denkyokumaku no Shintenkai* (New Development of Transparent Electrode Films), supervised by Yutaka Sawada and published by CMC Publishing Co., Ltd. (1999), and the described materials can be applied in the invention. In the case where a plastic substrate having low heat resistance is used, an anode prepared by film formation at low temperatures of not higher than 150° C. using ITO or IZO is preferable.

Cathode

As the cathode, in general, any material having a function as a cathode to inject an electron into the organic compound layer may be employed and is not particularly limited with respect to the shape, structure, size, etc. It can be adequately selected among known electrodes depending upon the application and purpose of the organic electroluminescent device.

As a material of the anode, for example, metals, alloys, metal oxides, electrically conductive compounds, and mixtures thereof are suitably enumerated. Of these, materials having a work function of not more than 4.5 eV are preferable. Specific examples thereof include alkali metals (for example, Li, Na, K, and Cs), alkaline earth metals (for example, Mg and Ca), gold, silver, lead, aluminum, sodium-potassium alloys, lithium-aluminum alloys, magnesium-silver alloys, and rare earth metals (for example, indium and ytterbium). Though these materials may be used singly, they are preferably used in combinations of two or more kinds thereof from the viewpoint of coping with both stability and electron injection properties.

Of these, alkali metals and alkaline earth metals are preferable from the viewpoint of electron injection properties, and materials composed mainly of aluminum are preferable because they have excellent storage stability.

The term "material composed mainly of aluminum" as referred to herein means aluminum alone or an alloy or mixture of aluminum and from 0.01 to 10% by weight of an alkali metal or an alkaline earth metal (for example, lithium-aluminum alloys and magnesium-aluminum alloys).

The material of the cathode is described in detail in JP-A-2-15595 and JP-A-5-121172.

The formation method of the cathode is not particularly limited and can be carried out according to known methods. For example, the cathode can be formed on the substrate according to a method which is adequately selected among wet systems (for example, printing system and coating system), physical systems (for example, vacuum vapor deposition process, sputtering process, and ion plating process), and chemical systems (for example, CVD and plasma CVD process) while taking into consideration adaptivity with the foregoing material. For example, in the case where a metal, etc. is selected as the material of the cathode, the cathode can be formed by sputtering one or two or more kinds thereof simultaneously or successively.

The patterning of the cathode may be carried out by chemical etching by photolithography, etc. or physical etching using laser, etc. Also, the patterning of the anode may be carried out by vacuum vapor deposition or sputtering by superimposing a mask, or may be carried out by the lift-off process or the printing process.

The position at which the cathode is formed in the organic electroluminescent device is not particularly limited and can be adequately selected depending upon the application and purpose of the organic electroluminescent device. However, it is preferable that the cathode is formed on the organic compound layer. In this case, the cathode may be formed entirely or partially on the one surface of the organic compound layer.

Also, a dielectric layer made of a fluoride of the alkali metal or alkaline earth metal may be inserted in a thickness of from 0.1 to 5 nm between the cathode and the organic compound layer.

The dielectric layer can be, for example, formed by the vacuum vapor deposition process, the sputtering process, the ion plating process, etc.

The thickness of the cathode can be adequately selected depending upon the foregoing material. Though the thickness of the cathode cannot be unequivocally defined, it is usually from 10 nm to 5 μm, and preferably from 50 nm to 1 μm.

The cathode may be transparent or opaque. The transparent cathode can be formed by subjecting the material of the cathode to film formation into a thin thickness of from 1 to 10 nm and further laminating a transparent conductive material such as ITO and IZO thereon.

Other Layers

Other layers can be adequately selected without particular limitations depending upon the purpose, and examples thereof include a protective layer.

As the protective layer, those described in, for example, JP-A-7-85974, JP-A-7-192866, JP-A-8-22891, JP-A-10-275682, and JP-A-10-106746 are suitably enumerated.

The protective layer is formed on the superficial surface layer in the organic electroluminescent device. For example, in the case where the substrate, the anode, the organic compound layer, and the cathode are stacked in this order, the protective layer is formed on the cathode; and in the case where the substrate, the cathode, the organic compound layer, and the anode are stacked in this order, the protective layer is formed on the anode.

The shape, size, thickness, etc. of the protective layer can be adequately selected, and any material having a function to suppress invasion and/or permeation of a substance which likely deteriorates the organic electroluminescent device (for example, moisture and oxygen) into the organic electroluminescent device can be used without particular limitations. Examples thereof include silicon oxide, silicon dioxide, germanium oxide, and germanium dioxide.

The formation method of the protective layer is not particularly limited, and examples thereof include vacuum vapor deposition process, sputtering process, reactive sputtering process, molecular epitaxy process, cluster ion beam process, ion plating process, plasma polymerization process, plasma CVD process, laser CVD process, heat CVD process, and coating process.

Further, in the invention, it is also preferred to provide a sealing layer for the purpose of preventing invasion of moisture or oxygen into the respective layers in the organic electroluminescent device.

Examples of a material of the sealing layer include copolymers containing tetrafluoroethylene and at least one comonomer, fluorine-containing copolymers having a cyclic structure in the copolymer principal chain thereof, copolymers of two or more kinds selected from polyethylene, polypropylene, polymethyl methacrylate, polyimides, polyureas, polytetrafluoroethylene, polychlorotrifluoroethylene, polydichlorodifluoroethylene, chlorotrifluoroethylene and dichlorodifluoroethylene; water absorbing substances having a water absorption of 1% or more, moisture-proof substances having a water absorption of not more than 0.1%, metals (for example, In, Sn, Pb, Au, Cu, Ag, Al, Tl, and Ni), metal oxides (for example, MgO, SiO, $SiO_2$, $Al_2O_3$, GeO, NiO, CaO, BaO, $Fe_2O_3$, $Y_2O_3$, and $TiO_2$), metal fluorides (for example, $MgF_2$, LiF, $AlF_3$, and $CaF_2$), liquid fluorinated hydrocarbons (for example, perfluoroalkanes, perfluoroamines, and perfluoroethers), and liquid fluorinated hydrocarbons having dispersed therein an adsorbing agent capable of adsorbing moisture or oxygen.

In the organic electroluminescent device of the invention, light emission can be obtained by applying a voltage (usually from 2 to 4 volts) of direct current (which may contain an alternating current component, if desired) or a direct current between the anode and the cathode.

With respect to the drive of the organic electroluminescent device of the invention, methods described in JP-A-2-148687, JP-A-6-301355, JP-A-5-29080, JP-A-7-134558, JP-A-8-234685, JP-A-8-241047, U.S. Pat. Nos. 5,828,429 and 6,023,308, and Japanese Patent No. 2,784,615 can be utilized.

EXAMPLES

The organic electroluminescent device of the invention will be described below with reference to the following Examples, but it should not be construed that the invention is limited to these Examples.

Example 1

A glass sheet of 0.5 mm in thickness and 2.5 cm in square was used as a substrate. This substrate was introduced into a vacuum chamber, and an ITO thin film (thickness: 0.2 μm) was formed as a transparent electrode using an ITO target (indium/tin=95/5 by mole) having an $SnO_2$ content of 10% by weight by means of DC magnetron sputtering (condition: substrate temperature of 250° C. and oxygen pressure of $1 \times 10^{-3}$ Pa). The ITO thin film had a surface resistance of 10 Ω/☐.

Next, the substrate having the transparent electrode formed thereon was charged in a cleaning vessel, cleaned with IPA, and then subjected to UV-ozone processing for 30 minutes.

On the resulting transparent substrate, a hole injection layer was provided in a thickness of 0.01 μm using copper phthalocyanine by the vacuum vapor deposition process at a rate of 1 nm/sec. Further, a hole transporting layer was provided in a thickness of 0.03 μm on the hole injection layer using N,N'-dinaphthyl-N,N'-diphenylbenzidine by the vacuum deposition process at a rate of 1 nm/sec.

The foregoing compound (4-1) as phosphorescent materials and $Balq_2$ were subjected to co-vapor deposition at a co-vapor deposition ratio of the compound (4-1) to $Balq_2$ of 5/95 to form a light emitting layer having a thickness of 0.03 μm on the hole transporting layer.

A block layer was provided on the light emitting layer. That is, the block layer was provided in a thickness of 0.01 μm using $Balq_2$ as an electron transporting material at a rate of 1 nm/sec.

On the block layer, an electron transporting layer was further provided in a thickness of 0.04 μm using tris-(8-hydroxyquinolinato)aluminum ($Alq_3$) as an electron transporting material by the vacuum vapor deposition process at a rate of 1 nm/sec.

On the electron transporting layer, an electron injection layer was further provided in a thickness of 0.002 μm using LiF as an electron injection material by means of vapor deposition at a rate of 1 nm/sec.

On the electron injection layer, a patterned mask (a mask having a light emitting area of 5 mm×5 mm) was further placed, and aluminum was subjected to vapor deposition in a thickness of 0.25 μm within a vapor deposition unit, to form a back electrode.

Aluminum wires were respectively wire bound from the transparent electrode (functioning as an anode) and the back electrode to form a light emitting laminate.

The resulting light emitting laminate was charged into a glove box purged with a nitrogen gas. 10 mg of a calcium oxide powder as a moisture adsorbing agent was charged in a stainless steel-made seal cover provided with a concave therein within the glove box, which was then fixed by an adhesive tape. This seal cover was sealed by a UV curable adhesive (XNR5516HV, manufactured by Nagase-CIBA Ltd.) as an adhesive.

There was thus prepared an organic electroluminescent device of Example 1.

The organic electroluminescent device was evaluated in the following methods.

Using a source measure unit Mode 2400, manufactured by TOYO TECHNICA INC., a direct current was applied to the organic EL device for light emission, thereby measuring an initial light emitting performance. At that time, the maximum luminance is defined as $L_{max}$, and the voltage at which $L_{max}$ was obtained is defined as $V_{max}$. Further, the luminous efficiency at the time of 300 $Cd/m^2$ is shown as an external quantum efficiency ($\eta_{300}$) in Table 1.

Also, a drive durability test was carried out at an initial luminance of 300 $Cd/m^2$, and after a lapse of 2,000 hours, a luminance maintenance rate (%) was determined. The results obtained are shown in Table 1.

TABLE 1

|  | $L_{max}$ (Cd/m²) | $V_{max}$ (V) | $\eta_{300}$ (%) | Luminance maintenance rate (%) |
|---|---|---|---|---|
| Example 1 | 22,500 | 14 | 7.5 | 98 |
| Comparative Example 1 | 15,400 | 14 | 6.1 | 63 |
| Example 2 | 28,500 | 14 | 7.8 | 98 |
| Comparative Example 2 | 14,300 | 15 | 6.0 | 61 |
| Example 3 | 25,500 | 15 | 6.8 | 96 |
| Comparative Example 3 | 12,300 | 15 | 4.7 | 56 |
| Example 4 | 17,400 | 15 | 6.5 | 95 |
| Comparative Example 4 | 11,200 | 15 | 4.2 | 55 |
| Example 5 | 24,800 | 15 | 6.8 | 97 |
| Comparative Example 5 | 15,700 | 15 | 4.8 | 61 |
| Example 6 | 22,400 | 15 | 7.2 | 91 |
| Comparative Example 6 | 18,700 | 15 | 4.9 | 50 |
| Example 7 | 21,400 | 15 | 6.8 | 85 |
| Comparative Example 7 | 2,400 | 18 | 1.5 | 88 |

Comparative Example 1

A device was prepared in the same manner as in Example 1, except that in Example 1, 4,4'-N,N'-dicarbazolebiphenyl (CBP) was used as the host material in place of Balq$_2$ and then evaluated. The results obtained are shown in Table 1.

Example 2

A device was prepared in the same manner as in Example 1, except that in Example 1, the foregoing compound (3-1) was used as the phosphorescent material in place of the compound (4-1) and then evaluated. The results obtained are shown in Table 1.

Comparative Example 2

A device was prepared in the same manner as in Example 2, except that in Example 2, 4,4'-N,N'-dicarbazolebiphenyl (CBP) was used as the host material in place of Balq$_2$ and then evaluated. The results obtained are shown in Table 1.

Example 3

A device was prepared in the same manner as in Example 1, except that in Example 1, the foregoing compound (5-1) was used as the phosphorescent material in place of the compound (4-1) and then evaluated. The results obtained are shown in Table 1.

Comparative Example 3

A device was prepared in the same manner as in Example 3, except that in Example 3, 4,4'-N,N'-dicarbazolebiphenyl (CBP) was used as the host material in place of Balq$_2$ and then evaluated. The results obtained are shown in Table 1.

Example 4

A device was prepared in the same manner as in Example 1, except that in Example 1, the foregoing compound (2-11) was used as the phosphorescent material in place of the compound (4-1) and then evaluated. The results obtained are shown in Table 1.

Comparative Example 4

A device was prepared in the same manner as in Example 4, except that in Example 4, 4,4'-N,N'-dicarbazolebiphenyl (CBP) was used as the host material in place of Balq$_2$ and then evaluated. The results obtained are shown in Table 1.

Example 5

A device was prepared in the same manner as in Example 1, except that in Example 1, the foregoing compound (3-6) was used as the phosphorescent material in place of the compound (4-1) and then evaluated. The results obtained are shown in Table 1.

Comparative Example 5

A device was prepared in the same manner as in Example 5, except that in Example 5, 4,4'-N,N'-dicarbazolebiphenyl (CBP) was used as the host material in place of Balq$_2$ and then evaluated. The results obtained are shown in Table 1.

Example 6

A device was prepared in the same manner as in Example 1, except that in Example 1, the foregoing compound (5-7) was used as the phosphorescent material in place of the compound (4-1) and then evaluated. The results obtained are shown in Table 1.

Comparative Example 6

A device was prepared in the same manner as in Example 6, except that in Example 6, 4,4'-N,N'-dicarbazole-biphenyl (CBP) was used as the host material in place of Balq$_2$ and then evaluated. The results obtained are shown in Table 1.

Example 7

A device was prepared in the same manner as in Example 1, except that in Example 1, a Ga complex represented by formula (a) was used as the host material in place of Balq$_2$ and then evaluated. The results obtained are shown in Table 1.

Formula (a)

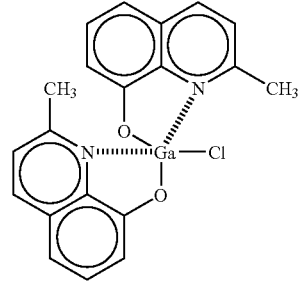

Comparative Example 7

A device was prepared in the same manner as in Example 1, except that in Example 1, a porphyrin Pt complex light emitting material represented by formula (c) was used as the phosphorescent material in place of the compound (4-1) and then evaluated. The results obtained are shown in Table 1.

(C)

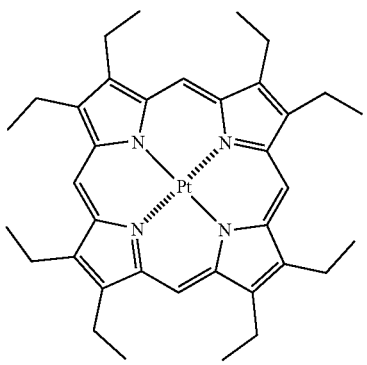

As is clear from these results, it is noted that the organic electroluminescent devices of the invention comprising a light emitting layer containing a five-coordinate metal complex, especially Balq$_2$ as a host material and an Ir complex having a partial structure represented by any one of the foregoing formulae (2) to (5) as a light emitting material are excellent with respect to the luminous efficiency and durability as compared with the devices which are free from such compounds.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

This application is based on Japanese Patent Application Nos. JP2004-53158 and JP2004-271134, filed on Feb. 27, 2004 and Sep. 17, 2004, respectively, the contents of which is incorporated herein by reference.

What is claimed is:

1. An organic electroluminescent device comprising:
a pair of electrodes; and
at least one organic compound layer between the pair of electrodes, the at least one organic compound layer comprising a light emitting layer,
wherein the light emitting layer comprises: a host material comprising a five-coordinate metal complex; and a phosphorescent material comprising an Ir complex having a partial structure represented by formula 24:

Formula (24)

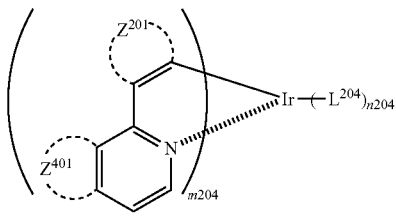

wherein $Z^{201}$ represents an atomic group for forming a phenyl group; $Z^{401}$ represents an atomic group for forming an aryl ring or a heteroaryl ring to be fused with the pyridine ring; $L^{204}$ represents a ligand; $n^{204}=0$, and $m^{204}=3$, and wherein the five-coordinate metal complex is a compound represented by formula (101):

Formula (101)

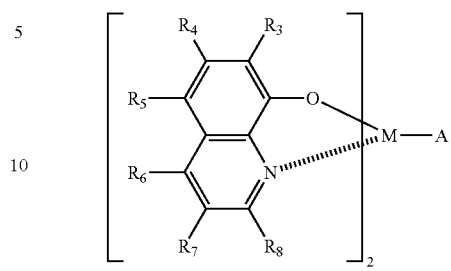

wherein M represents Al, Ga, or In; $R_3$ to $R_8$ each independently represents a hydrogen atom, an alkyl group, or an alkoxy group; A represents —O—Ar or a halogen atom; and Ar represents an optionally substituted aryl group.

2. The organic electroluminescent device of claim 1, wherein the phosphorescent material is an Ir complex represented by formula (4-1):

(4-1)

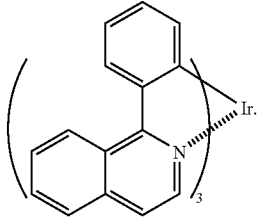

3. The organic electroluminescent device of claim 2, wherein M represents Al.

4. The organic electroluminescent device of claim 2, wherein the five-coordinate metal complex is aluminum(III) bis(2-methyl-8-quinolinato)-4-phenylphenolate.

5. The organic electroluminescent device of claim 1, wherein M represents Al.

6. The organic electroluminescent device of claim 1, wherein the five-coordinate metal complex is aluminum(III) bis(2-methyl-8-quinolinato)-4-phenylphenolate.

7. The organic electroluminescent device of claim 1, wherein Z401 represents an atomic group for forming an aryl ring to be fused with the pyridine ring.

8. The organic electroluminescent device of claim 7, wherein the atomic group forming an aryl ring to be fused with the pyridine ring has from 6 to 20 carbon atoms.

9. The organic electroluminescent device of claim 8, wherein the atomic group forming an aryl ring to be fused with the pyridine ring is a phenyl group, a naphthyl group, an anthryl group, a phenanthryl group, or a pyrenyl group.

10. The organic electroluminescent device of claim 8, wherein the atomic group forming an aryl ring to be fused with the pyridine ring has from 6 to 12 carbon atoms.

11. The organic electroluminescent device of claim 10, wherein the atomic group forming an aryl ring to be fused with the pyridine ring is a phenyl group or a naphthyl group.

12. The organic electroluminescent device of claim 11, wherein the atomic group forming an aryl ring to be fused with the pyridine ring is a naphthyl group.

* * * * *